United States Patent [19]
Jankowski et al.

[11] Patent Number: 4,914,600
[45] Date of Patent: Apr. 3, 1990

[54] PROGRAMMABLE FREQUENCY IDENTIFIER CIRCUIT

[75] Inventors: Cecelia Jankowski, East Norwich; David A. Giangano, Elmhurst; Vincent T. Jovene, Jr., East Northport, all of N.Y.

[73] Assignee: Gruman Aerospace Corporation, Bethpage, N.Y.

[21] Appl. No.: 58,445

[22] Filed: Jun. 5, 1987

[51] Int. Cl.$^4$ ............................................. G01R 23/02
[52] U.S. Cl. ................................ 364/484; 324/78 D; 324/78 F
[58] Field of Search ........... 364/484; 324/78 D, 78 F; 328/138, 140

[56] References Cited

U.S. PATENT DOCUMENTS

| | | | |
|---|---|---|---|
| 3,949,177 | 4/1976 | Ball et al. | 324/78 D |
| 3,990,007 | 11/1976 | Hohhof | 324/78 D |
| 4,004,236 | 1/1977 | Cardon et al. | 328/138 |
| 4,021,653 | 5/1977 | Sharp et al. | 235/152 |
| 4,042,788 | 8/1977 | Richards | 379/283 |
| 4,047,114 | 9/1977 | Lane et al. | 328/140 |
| 4,049,958 | 9/1977 | Hartmann | 364/825 |
| 4,061,885 | 12/1977 | Nash et al. | 379/283 |
| 4,216,463 | 8/1980 | Backof, Jr. et al. | 324/78 D |
| 4,295,128 | 10/1981 | Hashemian et al. | 324/78 D |
| 4,302,738 | 11/1981 | Cabot et al. | 328/138 |
| 4,319,334 | 3/1982 | Gurry | 364/484 |
| 4,377,793 | 3/1983 | Horna | 333/165 |
| 4,395,762 | 7/1983 | Wondergem et al. | 364/484 |
| 4,584,694 | 4/1986 | Gumacos | 364/484 |

Primary Examiner—Bruce Y. Arnold
Assistant Examiner—Terry S. Callaghan
Attorney, Agent, or Firm—Morgan & Finnegan

[57] ABSTRACT

A programmable frequency identifier circuit for identifying the frequency of a contaminated signal including a digital finite impulse response filter, a zero crossing detector, a zero crossing counter, and a frequency range decoder. The filter is a programmable filter for filtering signals of the form: $S(n)=S_1(n)+S_2(n)=A \cos 2\pi F_1(n)+B \cos 2\pi F_2(n)$ where $S_1(n)$=desired signal, $S_2(n)$=contamination, $F_1$=passband frequency, $F_2$=stopband frequency, and A,B=constants. The zero-crossing counter counts the sign changes occuring during a programmably determined frame time. The number of zero crossings occuring during the frame time is a number representing the desired frequency. The frequency range decoder is programmed with a plurality of frequency range boundaries similarly represented by a count that is based upon the programmable frame time. The count representing the desired frequency is successively compared to the counts representing the frequency range boundaries to identify the frequency range, if any, that contains the desired frequency. Successively reprogramming the frequency range boundaries enables the operator to find a frequency range and then fine tune the frequency range to identify the frequency to a satisfactory precision.

8 Claims, 12 Drawing Sheets

PROGRAMMABLE FREQUENCY IDENTIFIER CIRCUIT

TECHNICAL FIELD

This invention relates to a frequency identification circuit. More particularly this invention relates to a programmable digital circuit for identifying the frequency of a contaminated signal.

BACKGROUND

Frequency identification circuits are used in various signal processing and telecommunication applications. A problem with prior art frequency identification circuits is that the circuits typically are designed for a specific application and identify a frequency only within a specific band. For example, Ikeda (U.S. Pat. No. 4,334,273) discloses an apparatus for detecting the tone signal in a telephone switching system using a discrete Fourier transform process. As another example, Wondergem et al (U.S. Pat. No. 4,395,762) discloses a frequency counter for processing the output of a proton precession magnetometer. In addition, prior art frequency identifier circuit designs have tended to be complex.

SUMMARY OF THE INVENTION

An object of this invention is to provide a generic frequency identification circuit which is simple in design with a flexibility enabling a broad range of applications.

Another object of this invention is to provide a programmable frequency identification circuit.

Another object of this invention is to implement a frequency identification circuit with a programmable digital filter, a zero-crossing counter, and a programmable frequency range decoder.

These and other objects of the invention are provided by a circuit for identifying the frequency of a contaminated signed signal including a digital filter, a zero-crossing detector, a zero-crossing counter, and a frequency range decoder. The digital filter is a programmable digital filter which in one embodiment is a four tap linear phase finite impulse response filter although other types of filters may be used. Four coefficients can be input to the filter to achieve programmability for filtering signals of the form:

$$S(n) = S_1(n) + S_2(n) = A \cos 2\pi F_1(n) + B \cos 2\pi F_2(n)$$

where
  $S_1(n)$ = Desired signal
  $S_2(n)$ = Contamination
  $F_1$ = Passband frequency
  $F_2$ = Stopband frequency
  A,B = Constants.

The zero-crossing detector detects sign changes in the filtered signal and tallies the number of changes that occur during a frame using a zero crossing counter. The frame time denotes a programmably determined time greater than or equal to the time between recursions of the desired signal, $S_1(n)$, within the contaminated signed signal, $S(n)$.

The frequency range decoder is programmable to receive frequency range boundaries which define a contiguous range of frequencies. The count of sign changes of the filtered signal is decoded to identify which, if any, of the frequency ranges includes the frequency of the filtered signal.

DETAILED DESCRIPTION OF A PREFERRED EMBODIMENT OF THE INVENTION

Figure 1:
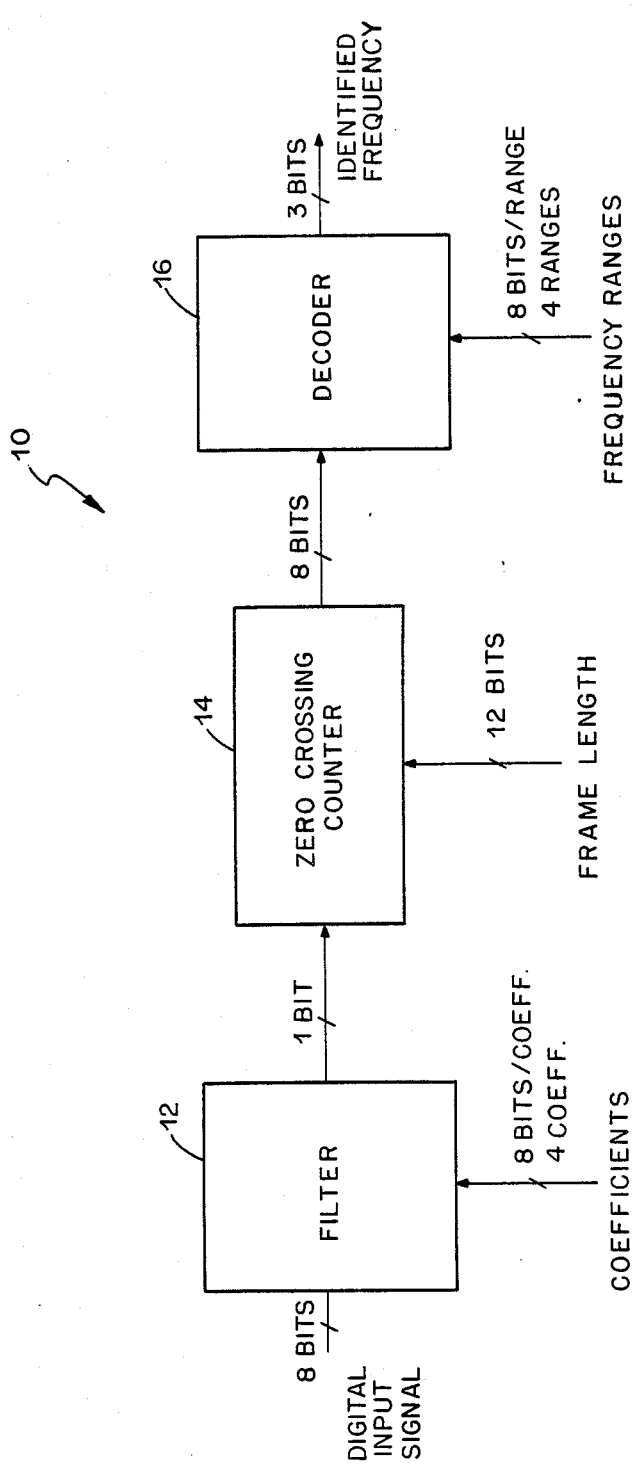
FIG. 1 is a block diagram of the frequency identification circuit showing three stages: the filter stage, the zero-crossing stage, and the decoder stage.

Overview:

The preferred embodiment of the frequency identification circuit is presented in FIGS. 1 to 7. With reference to FIG. 1, the frequency identification circuit 10 has three stages: a filter stage 12, a zero crossing counter stage 14, and a decoder stage 16.

The circuit 10 has 4 inputs: a digitized input signal, four filter coefficients, a frame length, and five frequency range boundaries. The bit precision for each of the inputs may vary among embodiments. The digitized input signal is a digital representation of the contaminated signed signal. The filter coefficients define the characteristics of a filter within the filter stage 12. The frame length is a reference time frame for tallying zero-crossing counter increments. The frequency range boundaries define frequency ranges for identifying the frequency of the digitized input signal.

The capability of inputting filter coefficients, frame length, and frequency range boundaries enable the frequency identification circuit to be programmed to identify frequencies over a broad range with high precision. Identification of input signal frequencies over a broad range is achieved through the input of filter coefficients thereby enabling the filter stage to be programmed. Identification of frequencies to a high precision is achieved through the input of frequency range boundaries which enable the decoder stage to iteratively subdivide the frequency ranges.

It is understood that the number of filter coefficients and the number of frequency range boundaries may vary for other embodiments.

The digitized input signal, S(n), enters the circuit 10 at the filter stage 12. The filter stage 12 includes a four tap linear phase finite impulse response filter which has its passband and stopband characteristics defined by the four filter coefficients. The changes in sign of the digital filtered signal are detected within the filter stage and trigger a pulse which is output from the filter stage 12 into the zero-crossing counter stage 14.

The zero-crossing counter stage counts the number of pulses during each frame. The total pulse count during the frame is a representation of the frequency of the passband signal. This representation is loaded into the decoder stage 16 at the end of the frame.

Within the decoder stage 16 the count is compared to the frequency range boundaries. The number of zero crossings corresponding to each boundary represents the frequency range boundaries in the same manner that the zero-crossing counter pulse count is a representation of the filtered signal's frequency. Thus, each boundary is scaled to the frame time for straight forward comparison with the pulse count. The comparison results are used to identify which frequency range, if any, contains the frequency sought to be identified. By varying the frequency ranges, subsequent comparisons can be made to find a correct range or to refine the range so that the frequency can be precisely identified.

Filter Stage:

In the preferred embodiment the filter is a four tap linear phase finite impulse response filter designed to identify a frequency, $F_1$, from a signal of the form:

$$S(n)=S_1(n)+S_2(n)=A \cos 2\pi F_1(n) + B \cos 2\pi F_2(n)$$

where
- $S_1(n)$ = desired signal
- $S_2(n)$ = contamination
- $F_1$ = Passband frequency
- $F_2$ = Stopband frequency
- A,B = Constants.

The filter reduces the effect of the contaminating frequency. It is understood that the digital filter does not have to be a linear phase filter nor does the filter have to use four taps.

The filter equation implemented in the preferred embodiment is:

$$y(n)=h(0)*x(n)+h(1)*x(n-1)+h(2)*x(n-2)+h(3)*x(n-3)$$

where
- $y(n)$ = filtered signal
- $h(0)$ = impulse response function coefficient 0 = C1OUT
- $h(1)$ = impulse response function coefficient 1 = C2OUT
- $h(2)$ = impulse response function coefficient 2 = C3OUT
- $h(3)$ = impulse response function coefficient 3 = C4OUT
- $x(n)$ = input data sample at time n.
- $x(n-1)$ = input data sample at time n−1.
- $x(n-2)$ = input data sample at time n−2.
- $x(n-3)$ = input data sample at time n−3.

In the illustrated embodiment, the filter processing rate is 32 KHz and the data input and filter result rate are 8 KHz, though other rates may be used.

Figure 2:
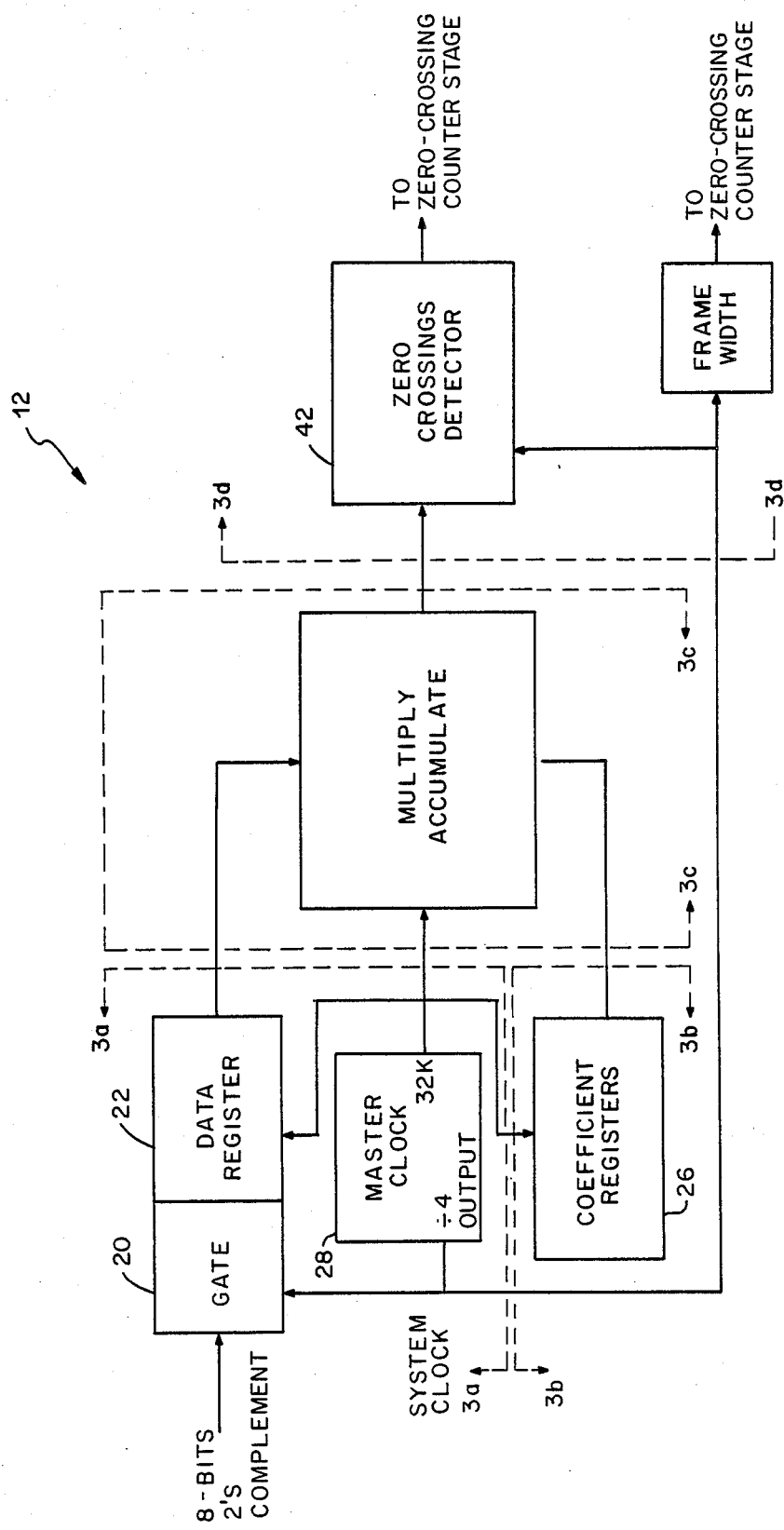
FIG. 2 is a block diagram of the filter stage of the frequency identification circuit.
Figure 3A:
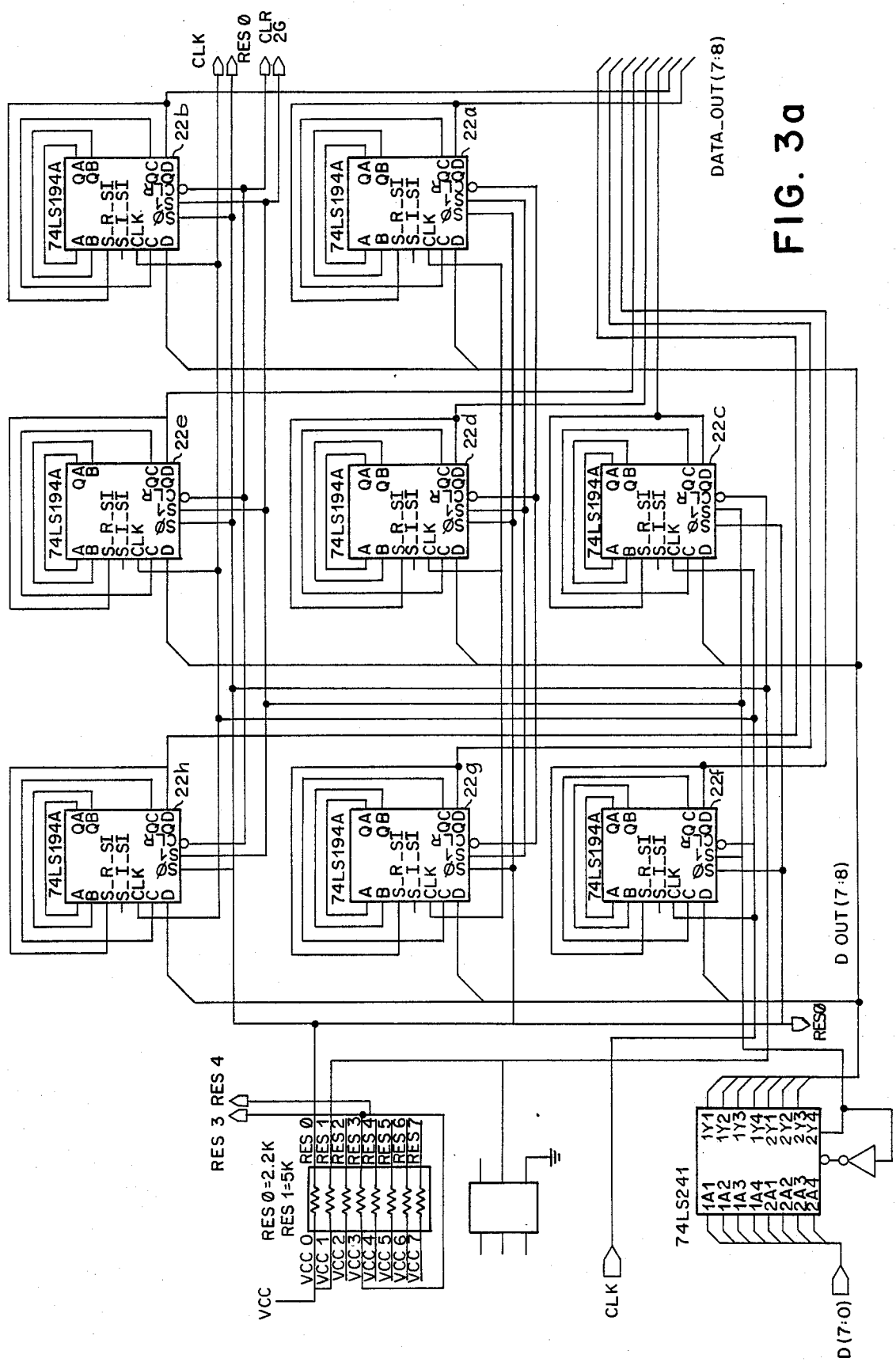
FIGS. 3a–3d are the circuit schematics of the filter stage.

With reference to FIGS. 2 and 3a, the digital input signal, S(n), is an 8 bit fractional two's complement signal input at a conventional gate 20, though the number of bits may vary for other embodiments. The gate is a 74LS241 tri-state octal bus driver which routes the 8 bits of data to eight data registers 22a–22h, one bit per register. The data registers 22a–h are conventional 74LS194A four bit shift registers.

A four bit register is used, even though only 1 bit of the eight bit input signal is loaded into each register. This enables four sequential input signals corresponding to the four filter equation inputs, x(n), x(n−1), x(n−2), x(n−3), to be processed.

Functionally, the shift registers operate on a four clock pulse cycle. During the first clock pulse the new input signal sample is loaded in parallel at pin D of each shift register 22. Also during the first pulse, the same sample is output on pin QD. This sample corresponds to the x(n) value of the filter equation and the eight bits comprising the QD outputs are input to the 8 most significant X channel lines of a multiply accumulate device 24. During the next three clock pulses the shift registers 22 operate as serial shift registers to output prior samples x(n−1), x(n−2), and x(n−3) which were input during prior clock pulses.

By wrapping around each of the four output lines of the shift registers to their input lines, the data sample output during the second clock pulse is the sample that was loaded during the previous cycle, similarly the sample output during the third clock pulse is the sample that was loaded during the second previous cycle and the sample output during the fourth clock pulse is the sample that was loaded during the third previous cycle. The QD output is wrapped around to the S-R-SI (shift right serial input). QA is wrapped around to A. QB is wrapped around to B. QC is wrapped around to C.

Figure 3B:
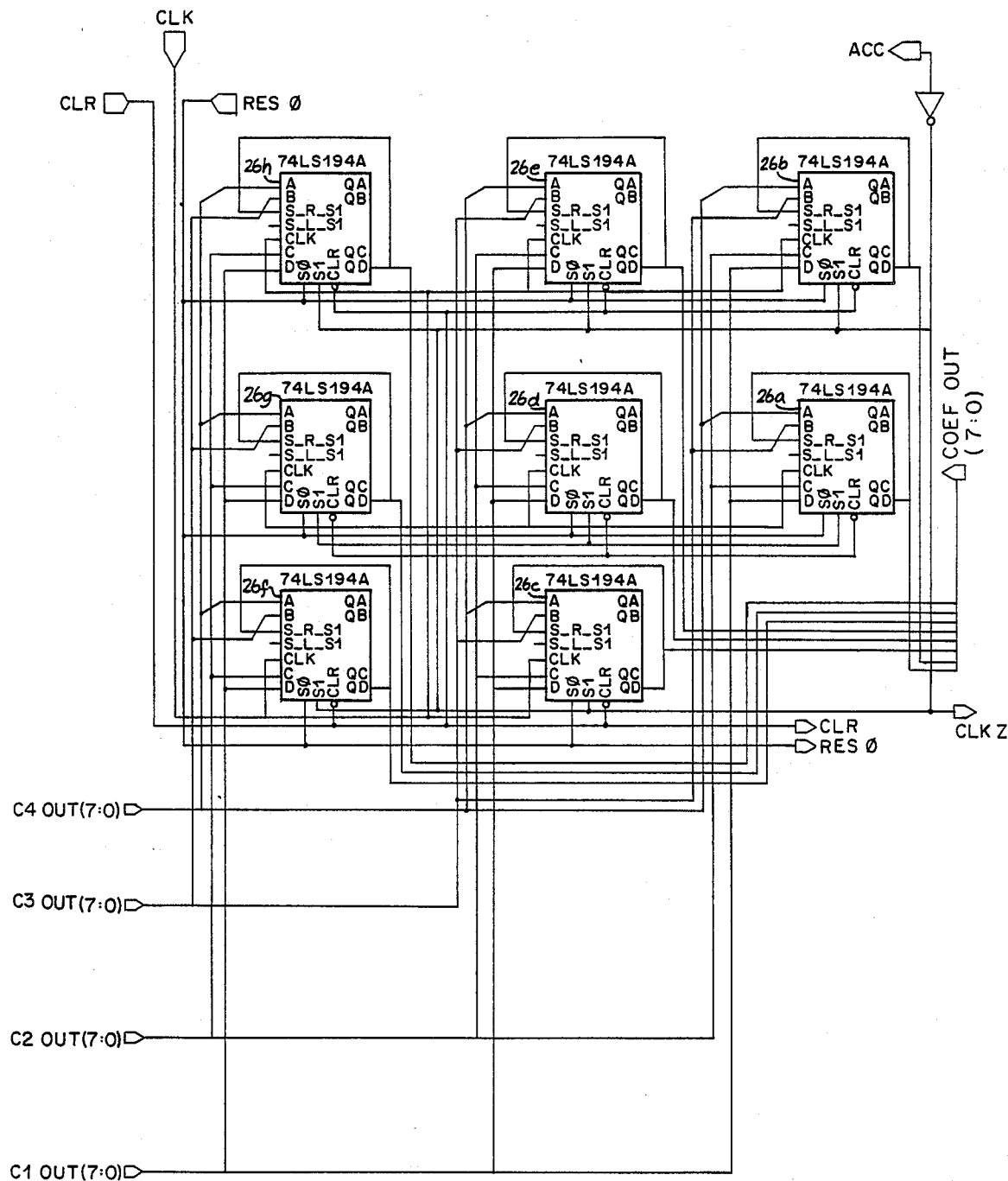

Referring to FIGS. 2 and 3b, the filter coefficients, designated C1OUT, C2OUT, C3OUT, and C4OUT are input into eight conventional 74LS194A shift registers. Each coefficient is an eight bit data word. One bit from each coefficient is input into each of the eight shift registers 26. The four coefficients are loaded into register 26 every four clock pulses. On the first pulse, the load pulse, the coefficient C1OUT is output. On the three subsequent pulses coefficients C2OUT, C3OUT, the C4OUT are output. One bit from each register 26 is output to provide an eight bit coefficient output to the eight most significant bit Y channel inputs of the multiply accumulate device 24.

Thus the multiply accumulate device 24 is loaded with the h(0) and x(n) values on th first clock pulse, the h(1) and x(n−1) values on the second clock pulse, the h(2) and x(n−2) values on the third clock pulse, and the h(3) and x(n−3) values on the fourth clock pulse.

Figure 3C:
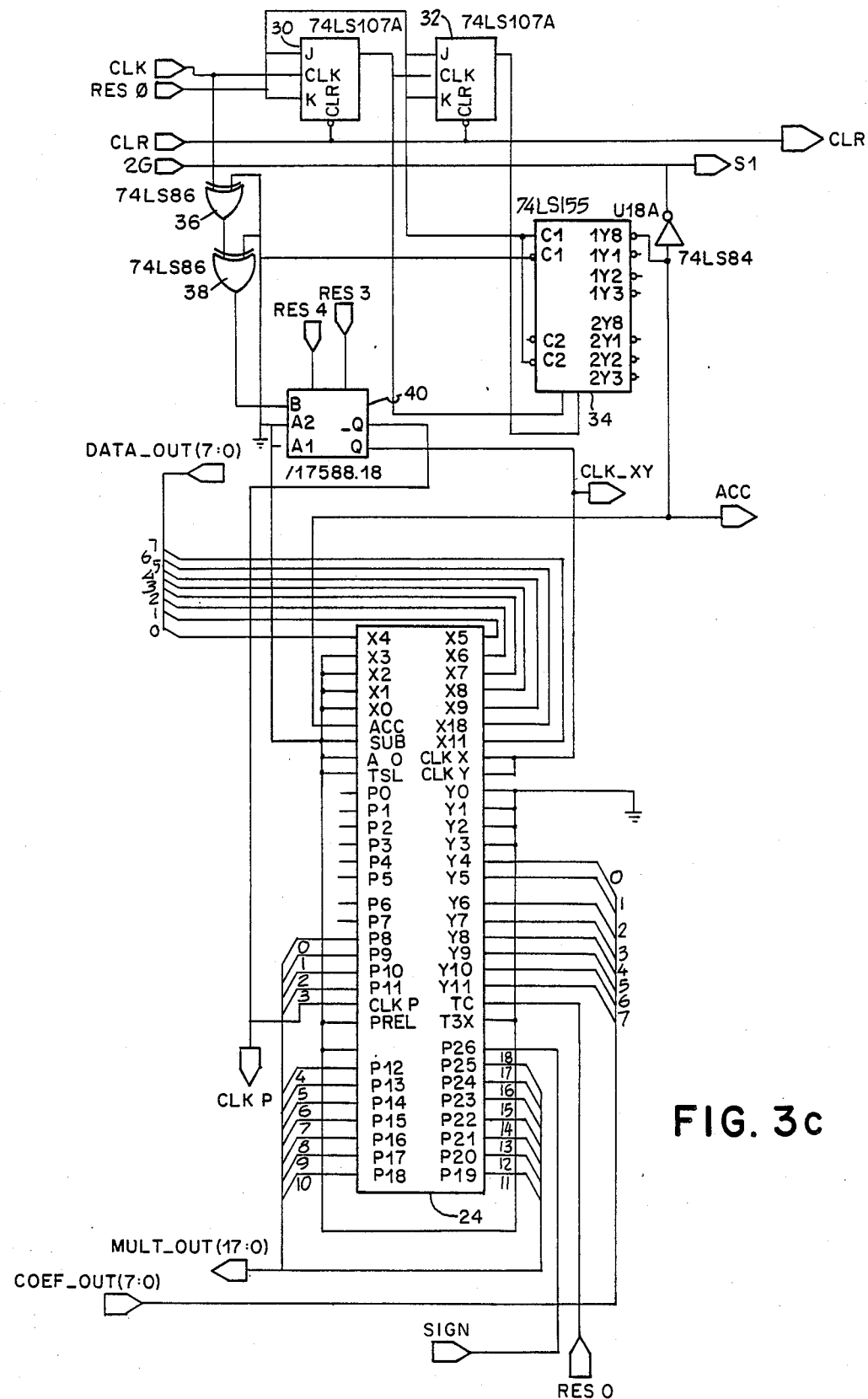

With reference to FIG. 3C; the multiply accumulate device 24 is a conventional TDC1009 mutliply/accumulate unit. The multiply accumulate device 24 implements the filter equation over four clock pulse cycle. On the first clock pulse a multiply without accumulate is performed (h(o)*x(n)). On the second pulse a multiply (h(1)*x(n−1)) and accumulate (. . . +(h(1)*x(n−1))) is performed. On the third pulse a multiply (h(2)*x(n−2)) and accumulate (. . . +(h(2)*x(n−2))) is performed. On the fourth pulse a multiply (h(3)*x(n−3)) and accumulate (. . . +(h(3)*x(n=3))) is performed.

Control signals define the function and timing of the device 24. To load in the h() and x() values a control pulse is active at the CLKY (Y channel input) and CLKX (X channel input) pins every pulse of the four pulse cycle. To direct the three addition operations a control signal is active at the ACC (accumulate) input of device 24 on the second, third, and fourth pulses of the four pulse cycle. To direct the four multiplication operations a control pulse is active at the CLKP (output product), every pulse of the four pulse cycle.

The control signals are derived from timing circuitry shown in FIG. 3c. The clock pulses, which ultimately are derived from a conventional clock 28 (FIG. 2), are input via line LA1 of FIG. 3c. A conventional 74LSL07A flip-flop 30, doubles the pulse width thereby dividing the clock frequency by two. Another conventional 74LS107A flip flop 32 doubles the pulse width again. The doubled and quadrupled pulses are input to a conventional 74LS155 decoder which outputs a control signal at pin 1Y0 that is one pulse wide on the first of every four clock pulses. This is the ACC control signal.

The clock signal also is input to an Exclusive OR gate 36, along with a ground signal. The Exclusive OR gate 36 generates an output to another conventional 74LS86 Exclusive OR gate 38 which in turn provides the B input to a conventional 74121 multivibrator 40. The multivibrator 40 outputs two signals. The Q output line is the control signal input to the multiply accumulate device 24 at CLKX and CLKY for clocking the data and coefficients into device 24 at the leading edge of each clock pulse. The _Q line is a control signal input to the multiply accumulate device 24 at CLKP for performing a multiply-accumulate at the rising edge of each clock pulse.

Figure 3D:
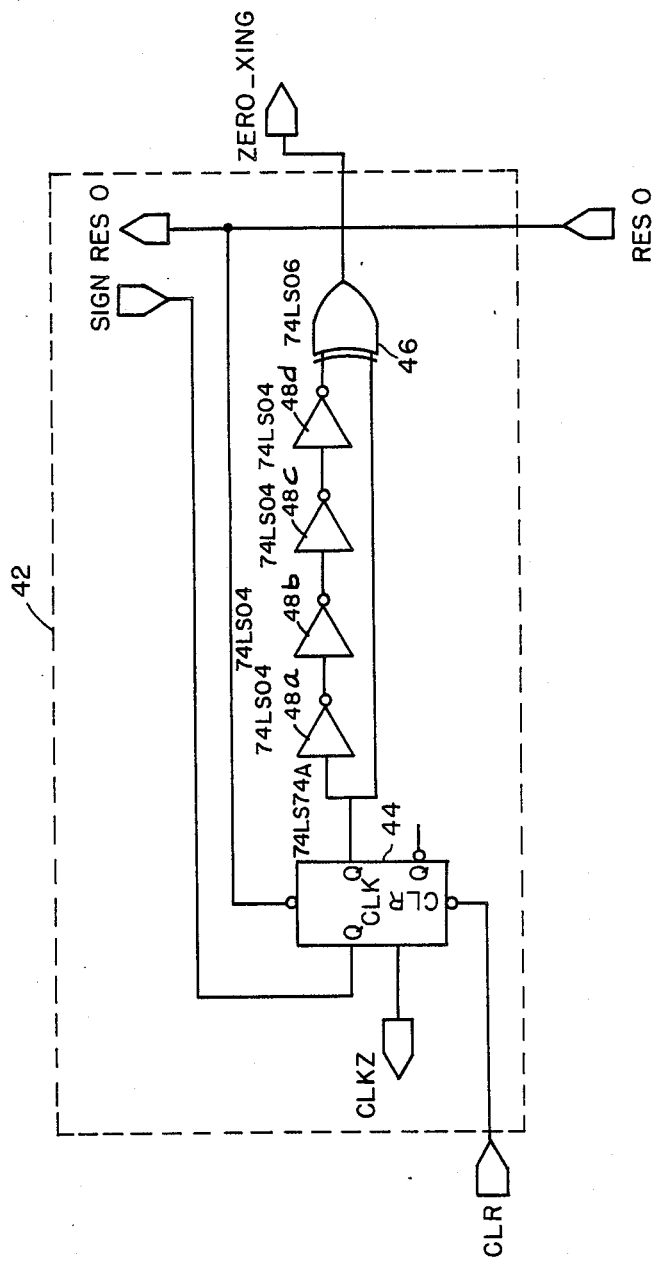

The most significant bit (at pin P26) of the product is the sign bit. Referring to FIG. 2, it is the sign bit which is output from the multiply accumulate device 24 into zero crossing detector 42. Referring to FIG. 3d, the zero crossing detector 42 includes a conventional 74L574A D flip flop 44. 74LS74A. The clock for flip-flop 44 is the CLKZ line from FIG. 3b which is the inversion of the ACC line. The output of the flip-flop 44 is input to an Exclusive OR gate 46 and a delay line consisting of conventional inverters 48a–d. The output of the Exclusive OR gate 46 is the output of zero crossing detector 42 and filter stage 12. This output is a pulse which is generated for every sign change of the filtered signal.

Zero-Crossing Counter Stage

Figure 4:
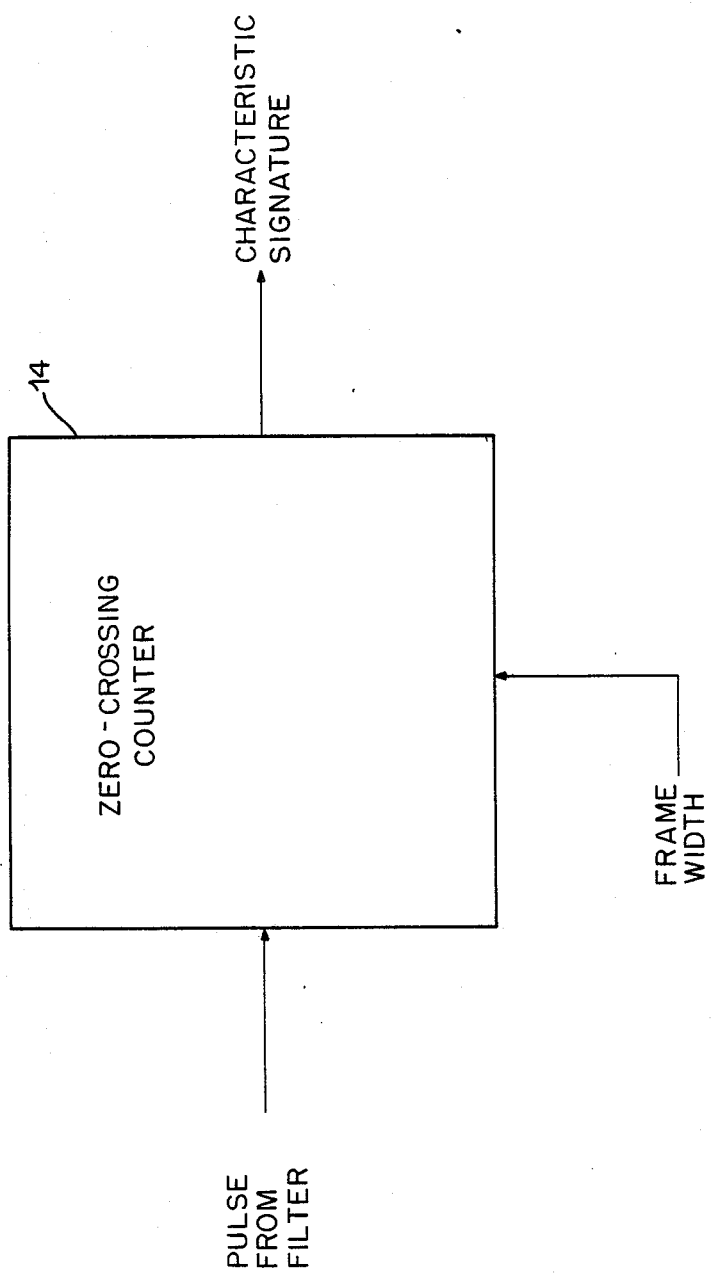
FIG. 4 is a block diagram of the zero crossing counter stage of the frequency identification circuit.

Referring to FIGS. 1 and 4, the zero-crossing counter stage 14 receives the sign-change pulse from the filter stage 12 and increments a counter to derive a sign change count corresponding to the frequency of the filtered signal. The sign change count indicates the zero crossings of the filtered signal occurring within a predetermined frame time. The sign change count is loaded into the decoder stage 16 at the end of the frame.

Figure 5A:
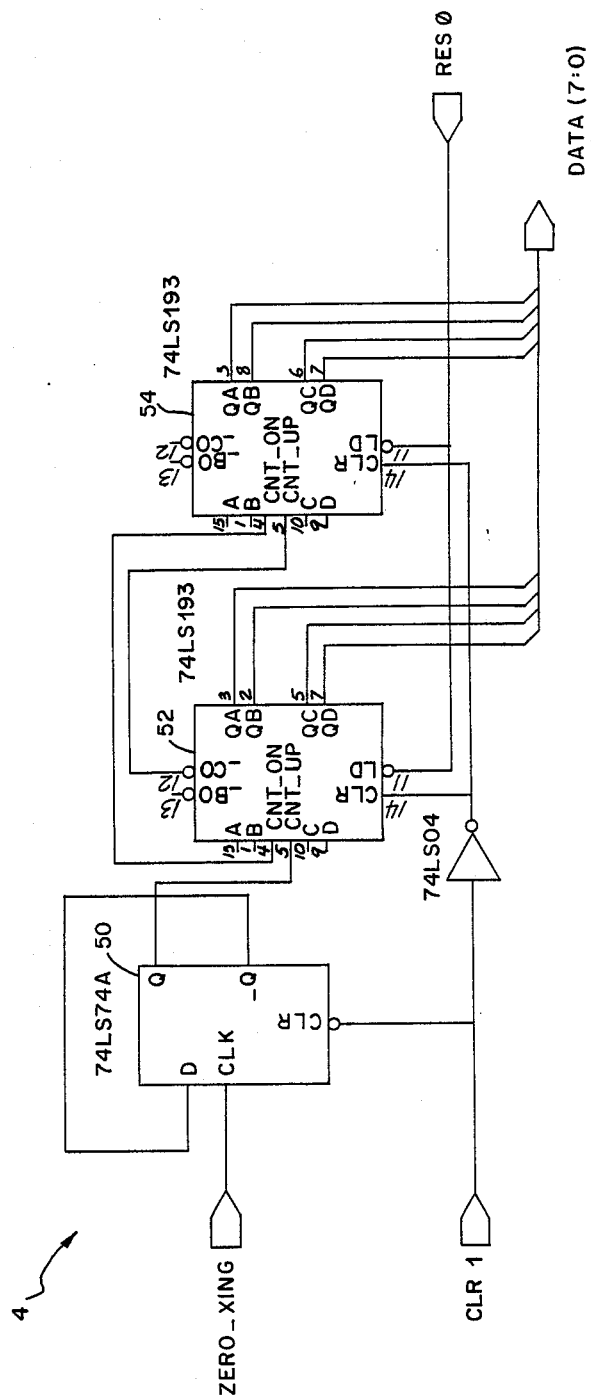
FIGS. 5a–5b are the circuit schematics of the zero crossing counter stage.

Referring to FIG. 5a the sign change pulse labelled as the ZERO_XING signal is input to the CLK input of a conventional 74LS74A 'D' flip-flop 50. The actual zero crossings count is halved by inputting the _Q output to the D input of the 'D' flip flop 50. Simultaneously the Q output also triggers a conventional counter 52, part no 74LS193, to increment for the sign changes of the filtered signal. Conventional counter 54, part No. 74LS193, is concatenated to counter 52 to provide an 8 bit counter. The count is a representation of the frequency of the filtered signal and is output from the zero crossing detector 14 at lines DATA (7:0). The D flip flop 50 and counters 52, 54 are cleared after each frame when the CLR input goes low.

Figure 5B:
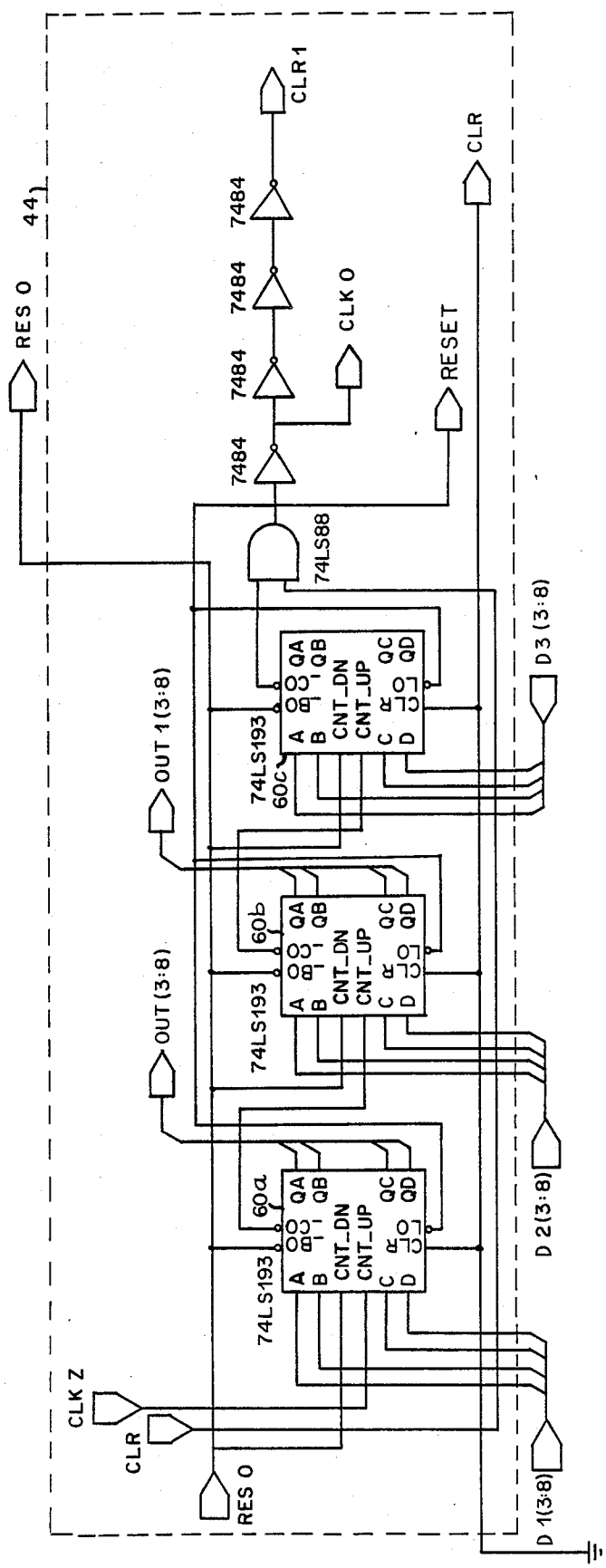

Referring to FIG. 5b, the circuits for monitoring the frame length are shown. Upon a RESET signal a 12 bit frame length, defined in terms of clock pulses, is loaded into three conventional four bit counters 60a–60c, part no 74LS193. In one embodiment the counters 60 are wired as up-counters so that the frame ends when the counters overflow. Thus, the frame count loaded is 4096 ($=2^{12}$) minus the desired frame count. When the counters overflow, a clear pulse CLR is generated at the _CO output of counter 60c (the carry output from the most significant order counter). The clear pulse is input to the decoder stage 16 to load in the zero-crossing count, which is shown as DATA (7:0) on FIG. 5a. Additionally the clear pulse, CLR, causes the zero crossing counters 52, 54 and the 'D' flip flop 50 to be cleared and the frame length counters to be reset.

Decoder Stage

Figure 6:
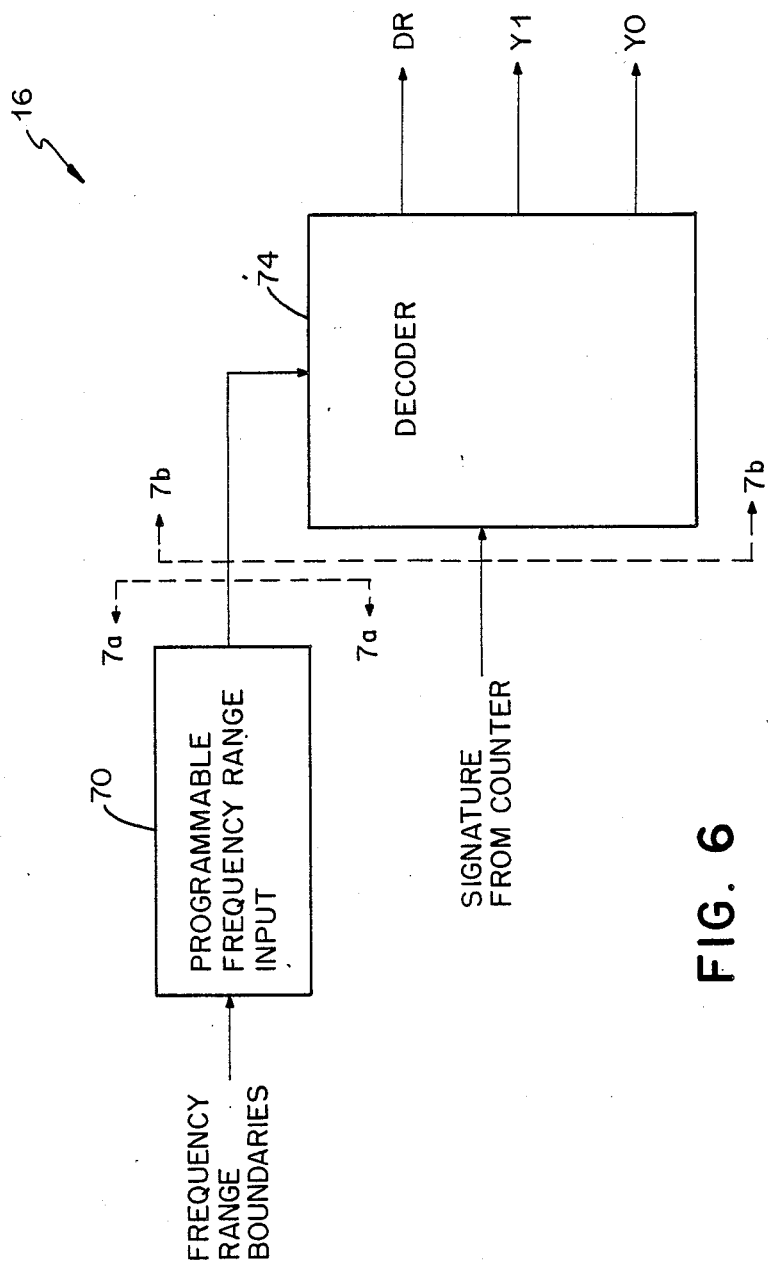
FIG. 6 is a block diagram of the decoder stage of the frequency identification circuit.

Referring to FIGS. 1 and 6, the decoder stage 16 inputs the frequency range boundaries and the pulse count, then decodes the count to determine (1) whether the frequency corresponding to the count is within the overall band defined by the frequency range boundaries and (2) which range includes the frequency. In one embodiment five frequency range boundaries are input to define four contiguous frequency ranges. The outputs Y0 and Y1 provide a binary signal for identifying which of the four ranges includes the filtered signal frequency. The output DR provides a status of whether the filtered signal frequency is within the overall band.

Figure 7A:
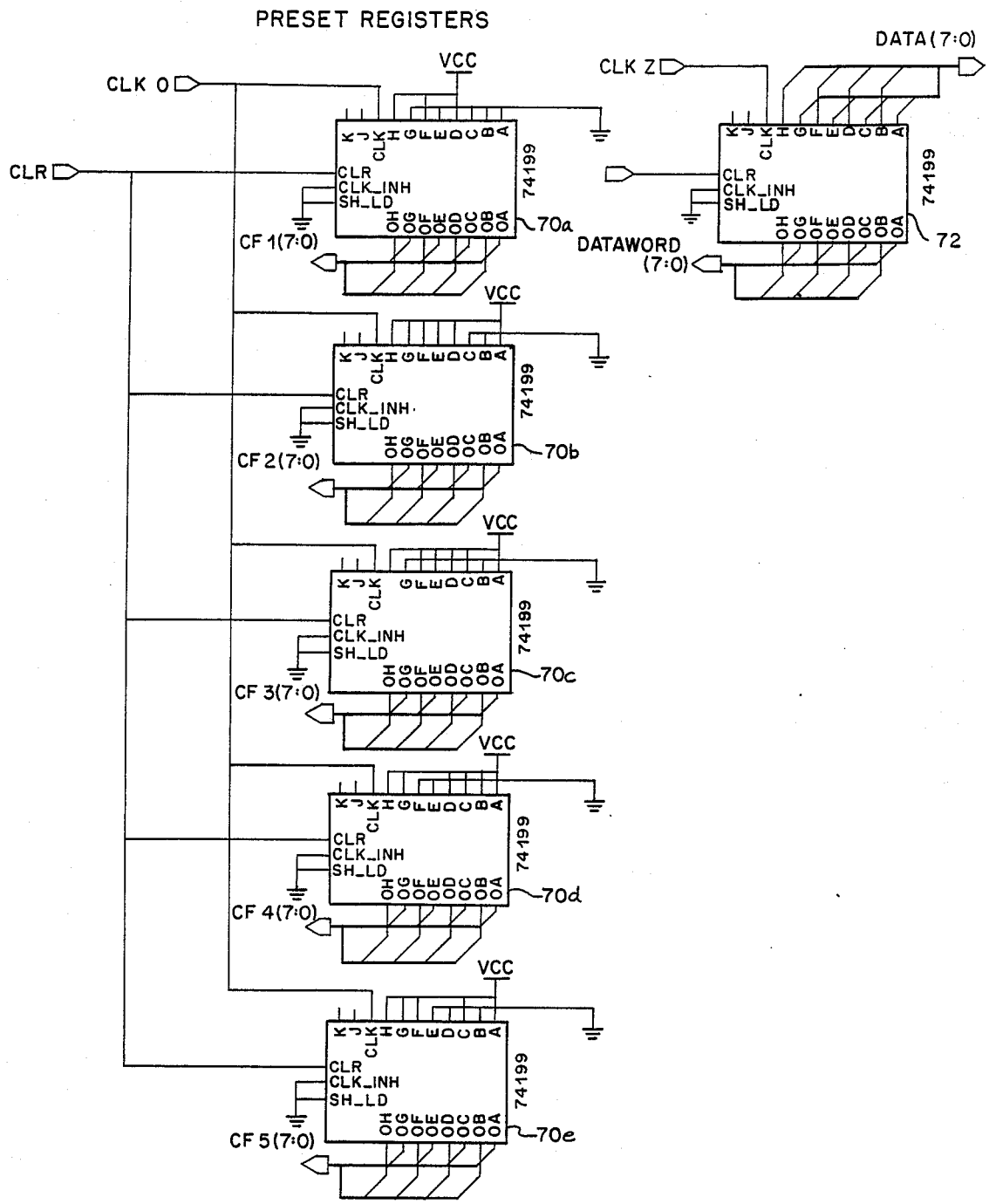
FIGS. 7a and 7b are the circuit schematics of the decoder stage.

Referring to FIGS. 6 and 7a, the five frequency range boundaries, respectively, are loaded into data registers 70a–e when the CLK0 line goes high, which is at the end of each frame. The frequency range boundaries are defined in numerical order as inputs CF1 to CF5. The zero-crossing counter pulse count, which is a representation of the filtered frequency, similarly, is loaded into a conventional 74199 register 72 at the end of the frame.

Figure 7B:
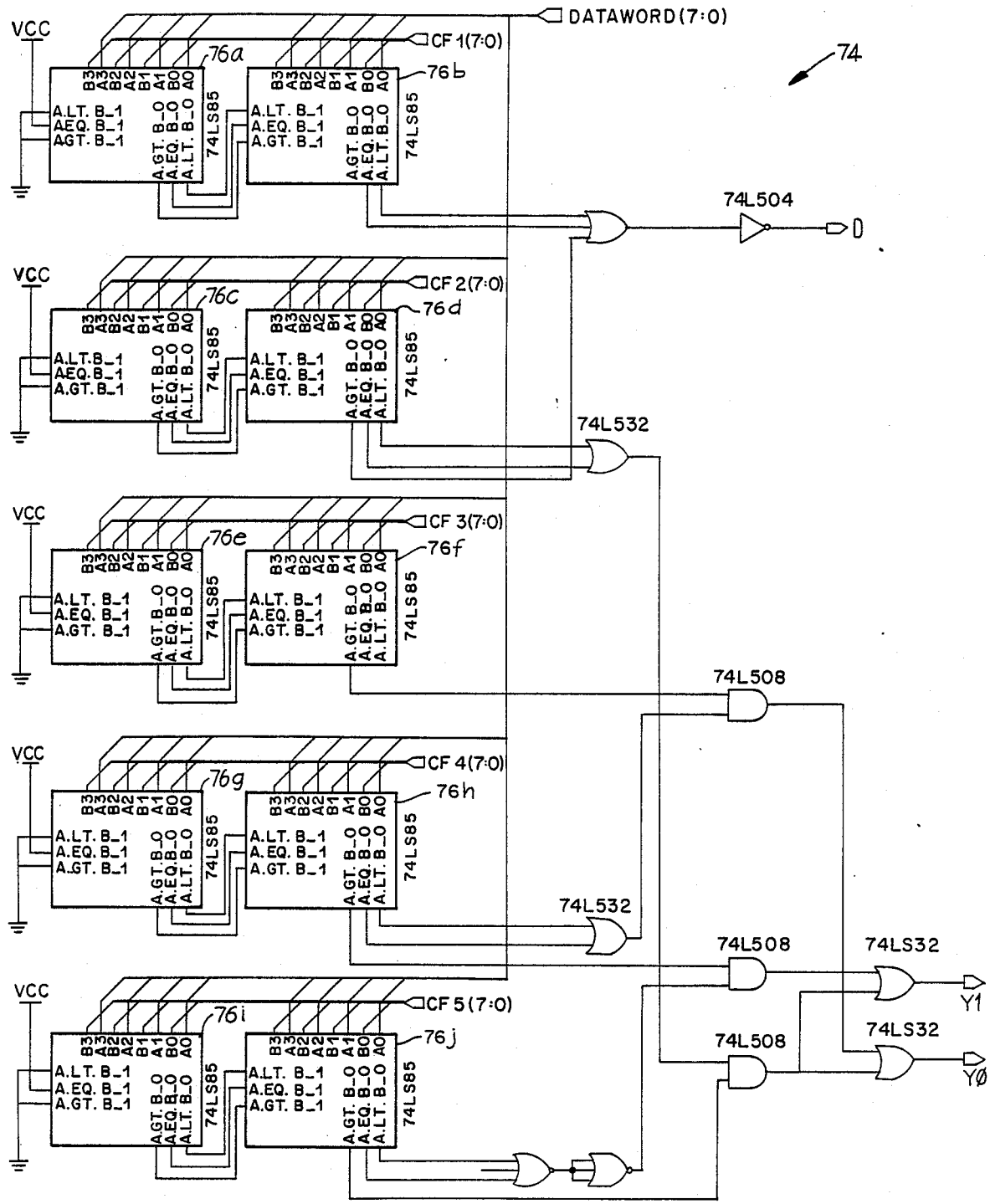

Refering to FIG. 7b, the decoder 74 includes 10 conventional 4 bit comparators 76a–j, part no. 74LS85. The comparators 76 functionally are grouped in pairs, such that each pair compares the count with a frequency range boundary. The first pair of comparators determine whether the count is less than the lowest frequency range boundary. If it is less than the boundary then the input frequency is not within any of the frequency ranges and output DR will be a '0.' The pulse count is also compared by the other four pairs of comparators to determine if it is greater than any or all of the other boundaries. If greater than all five of the boundaries, the count is too high and the frequency again is not within any of the frequency ranges, thereby causing output DR to be a '0'. If the count is less than one or more boundaries and greater than one or more boundaries output DR is a '1' and the Y0 and Y1 output lines will be valid to identify which of the four ranges includes the count. Conventional logic is used to identify which of the four ranges includes the filtered signal frequency and provide the two bit output identification at Y1 and Y0.

While preferred embodiments of this invention have been illustrated and described, the invention is capable of modification and addition without departing from its basic principles. Accordingly, the invention is not intended to be limited to the exact embodiment illustrated. The scope of the invention is intended to be determined by reference to the claims and their equivalents interpreted in light of the prior art.

We claim:

1. A circuit for identifying the frequency of a digital contaminated signed signal comprising:
    a filter for filtering the digital contaminated signed signal to produce a filtered signal;
    a means for detecting the changes in sign of the filtered signal;
    a means for counting the changes in the sign of the filtered signal within a programmable time period, thereby defining a representative count corresponding to the frequency of the filtered signal;
    a means for storing a plurality of frequency range boundaries which define a plurality of contiguous frequency ranges which in turn define a frequency band; and a means for decoding the representative count of the frequency of the filtered signal to identify whether the count is within the frequency band and to identify which specific frequency range within the frequency band includes the count.

2. The circuit of claim 1 wherein the filter is a finite impulse response filter.

3. The circuit of claim 2 wherein the finite impulse response filter is a four tap linear phase finite impulse response filter which produces the filtered signal from the digital contaminated signed signal in accordance with the general transformation function $$y(n) = h(0)*x(n) + h(1)*x(n-1) + h(2)*x(n-2) + h(3)*x(n-3)$$

wherein y(n) is the digital signed filtered signal, wherein n is the $n^{th}$ sample of the digital contaminated signal and wherein h(0), h(1), h(2), and h(3), are impulse response function values respectively corresponding to four filter coefficients input into the respective taps to define the filter passband and stopband characteristics.

4. A circuit for identifying the frequency of a digital contaminated signed signal comprising:

a finite impulse response filter for filtering the digital contaminated signed signal to produce a filtered signal and having a plurality of programmable filter coefficients which define the filter characteristics;

a means for detecting the changes in sign of the filtered signal;

a means for counting the changes in the sign of the filtered signal within a time period, thereby defining a representative count of the frequency of the filtered signal;

a means for storing a plurality of frequency range boundaries which define a plurality of contiguous frequency ranges which in turn define a frequency band; and a means for decoding the representative count of the frequency of the filtered signal to identify whether the count is within the frequency band and the specific frequency range within the frequency band.

5. The circuit of claim 4 wherein the time period used by the means for counting is a programmable time period.

6. The circuit of claim 4 further comprising a means for changing the plurality of frequency range boundaries.

7. A method for identifying the frequency of a digital contaminated signed signal comprising the steps of:

filtering the digital contaminated signed signal to produce a signed filtered signal;

counting the changes in the sign of the filtered signal during a programmable time period;

storing the count of changes occurring during the programmable time period;

storing a plurality of frequency range boundaries which define a plurality of contiguous frequency ranges which in turn define a frequency band;

decoding the count to identify whether the count is within the frequency band and to identify which specific frequency range within the frequency band includes the count.

8. The method of claim 7 further including the step of changing the stored plurality of frequency range boundaries to identify the frequency band and to refine the specific frequency range containing the count to a desired precision.

* * * * *